(12) United States Patent  
Daley et al.

(10) Patent No.: US 8,809,144 B2
(45) Date of Patent: Aug. 19, 2014

(54) ON-CHIP CAPACITORS WITH A VARIABLE CAPACITANCE FOR A RADIOFREQUENCY INTEGRATED CIRCUIT

(75) Inventors: Douglas M. Daley, Essex Junction, VT (US); Mete Erturk, Alburg, VT (US); Edward J. Gordon, Bristol, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/534,355

(22) Filed: Jun. 27, 2012

(65) Prior Publication Data

US 2012/0262229 A1 Oct. 18, 2012

Related U.S. Application Data

(62) Division of application No. 12/552,317, filed on Sep. 2, 2009, now Pat. No. 8,237,243.

(60) Provisional application No. 61/161,104, filed on Mar. 18, 2009.

(51) Int. Cl.
  *H01L 21/8234* (2006.01)
(52) U.S. Cl.
  USPC .......................................................... 438/238
(58) Field of Classification Search
  CPC .................................................. H01L 27/10852
  See application file for complete search history.

(56) References Cited

U.S. PATENT DOCUMENTS

| | | | |
|---|---|---|---|
| 5,208,725 A * | 5/1993 | Akcasu ......................... | 361/313 |
| 5,446,311 A | 8/1995 | Ewen et al. | |
| 6,762,088 B2 | 7/2004 | Acosta et al. | |
| 6,937,456 B2 | 8/2005 | Pasternak | |
| 7,531,407 B2 * | 5/2009 | Clevenger et al. ............. | 438/238 |
| 7,728,371 B2 * | 6/2010 | Cheng et al. .................. | 257/301 |
| 8,273,610 B2 * | 9/2012 | Or-Bach et al. ............... | 438/142 |
| 2005/0037568 A1 * | 2/2005 | Greco et al. ................... | 438/250 |
| 2005/0190529 A1 * | 9/2005 | Togashi ..................... | 361/306.1 |
| 2007/0075350 A1 | 4/2007 | Darabi et al. | |
| 2007/0123015 A1 | 5/2007 | Chinthakindi et al. | |
| 2007/0228514 A1 | 10/2007 | Den Dekker et al. | |
| 2007/0279835 A1 | 12/2007 | Chinthakindi | |

OTHER PUBLICATIONS

USPTO, Notice of Allowance issued in related U.S. Appl. No. 12/552,317 dated Apr. 19, 2012.

* cited by examiner

*Primary Examiner* — Charles Garber
*Assistant Examiner* — Andre' C Stevenson
(74) *Attorney, Agent, or Firm* — Wood, Herron & Evans LLP; Anthony J. Canale

(57) ABSTRACT

Methods of fabricating an on-chip capacitor with a variable capacitance, as well as methods of adjusting the capacitance of an on-chip capacitor and design structures for an on-chip capacitor. The method includes forming first and second ports configured to be powered with opposite polarities, first and second electrodes, and first and second voltage-controlled units. The method includes configuring the first voltage-controlled unit to selectively couple the first electrode with the first port, and the second voltage-controlled unit to selectively couple the second electrode with the second port. When the first electrode is coupled by the first voltage-controlled unit with the first port and the second electrode is coupled by the second voltage-controlled unit with the second port, the capacitance of the on-chip capacitor increases.

14 Claims, 6 Drawing Sheets

ON-CHIP CAPACITORS WITH A VARIABLE CAPACITANCE FOR A RADIOFREQUENCY INTEGRATED CIRCUIT

CROSS-REFERENCE TO RELATED APPLICATIONS

This application is a divisional of application Ser. No. 12/552,317, filed Sep. 2, 2009, which claims the benefit of U.S. Provisional Application No. 61/161,104, filed Mar. 18, 2009. Both of these documents are hereby incorporated by reference herein in their entirety.

BACKGROUND

The invention relates generally to semiconductor device fabrication and, in particular, to methods for fabricating an on-chip capacitor characterized by a tunable variable capacitance, as well as to methods of tuning an on-chip capacitor and design structures for an on-chip capacitor.

Capacitors are on-chip passive devices commonly employed in many types of monolithic integrated circuits designed to operate at high frequencies, such as those found in wireless communication devices. In particular, on-chip capacitors are found in radiofrequency integrated circuits (RFICs), which have applications such as Phase-Locked Loop (PLL) transmitters, voltage controlled oscillators (VCOs), impedance matching networks, filters, etc. The integration of on-chip capacitors may be accomplished by introducing these passive devices into one or more of the metallization levels of the back-end-of-line (BEOL) wiring structure. The BEOL wiring structure is used to electrically interconnect the active devices, such as field effect transistors (FETs), of the integrated circuit during front-end-of-line (FEOL) processing. A popular method of forming a BEOL wiring structure is a dual damascene process in which vias and trenches are formed in a dielectric layer and then filled with metal in a single process step.

A significant problem with conventional BEOL on-chip capacitors is an inability to tune the capacitance during actual circuit operation. This problem is especially acute for on-chip capacitors found in oscillators, which have a natural resonance frequency that is highly dependent on the capacitance. Manufacturing tolerances may cause significant variations in the capacitance of different capacitors on a chip, significant variations in the capacitance among nominally equivalent capacitors on different chips fabricated on a single wafer, and significant variations in the capacitance for nominally equivalent capacitors fabricated on different wafers. These capacitance variations among on-chip capacitors that have been designed to have a nominally identical capacitance can limit the reproducibility of the resonance frequency.

On-chip capacitors with the ability to actively adjust capacitance may be fabricated by FEOL processes. These on-chip capacitors rely on the capacitance of a p-n junction or the gate capacitance of an FET. However, FEOL on-chip capacitors require extra masks for manufacturing and, therefore, are costly. Because FEOL on-chip capacitors are entirely embedded within the semiconductor substrate, FEOL on-chip capacitors are also more susceptible to substrate noise, in comparison with capacitors sited in the BEOL wiring.

In summary, improved methods for fabricating an on-chip capacitor, as well as improved methods of tuning an on-chip capacitor, are needed that overcome these and other deficiencies of conventional device fabrication methods for on-chip capacitors and design structures for an on-chip capacitor.

BRIEF SUMMARY

In an embodiment of the invention, a method of fabricating a variable capacitance, on-chip capacitor includes forming first and second ports and first and second electrodes in a dielectric layer. The first and second ports are configured to be powered with opposite polarities. The method further includes forming a first voltage-controlled unit configured to selectively couple the first electrode with the first port, and forming a second voltage-controlled unit configured to selectively couple the second electrode with the second port. When the first electrode is coupled by the first voltage-controlled unit with the first port and the second electrode is coupled by the second voltage-controlled unit with the second port, the capacitance of the on-chip capacitor increases.

In another embodiment of the invention, a method is provided for tuning an on-chip capacitor during operation of an integrated circuit electrically coupled with the on-chip capacitor. The method includes powering first and second ports of the on-chip capacitor with opposite polarities, selectively connecting a first electrode with the first port using a first voltage signal supplied from the integrated circuit, and selectively connecting a second electrode with the second port using a second voltage signal supplied from the integrated circuit.

In another embodiment of the invention, a design structure is embodied in a machine readable medium for designing, manufacturing, or testing an integrated circuit. The design structure comprises an on-chip capacitor including first and second ports configured to be powered with opposite polarities, first and second electrodes, and first and second voltage-controlled units. Each of the first and second voltage-controlled units is configured to be switched between a first state in which the first and second electrodes are electrically isolated from the first and second ports and a second state. The first electrode is electrically connected with the first port when the first voltage-controlled unit is switched to the second state. The second electrode electrically is connected with the second port when the second voltage-controlled unit is switched to the second state. The on-chip capacitor has a larger capacitance value when the first and second voltage-controlled units are in the second state than when the first and second voltage-controlled units are in the first state. The design structure may comprise a netlist, may reside on storage medium as a data format used for the exchange of layout data of integrated circuits, or may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
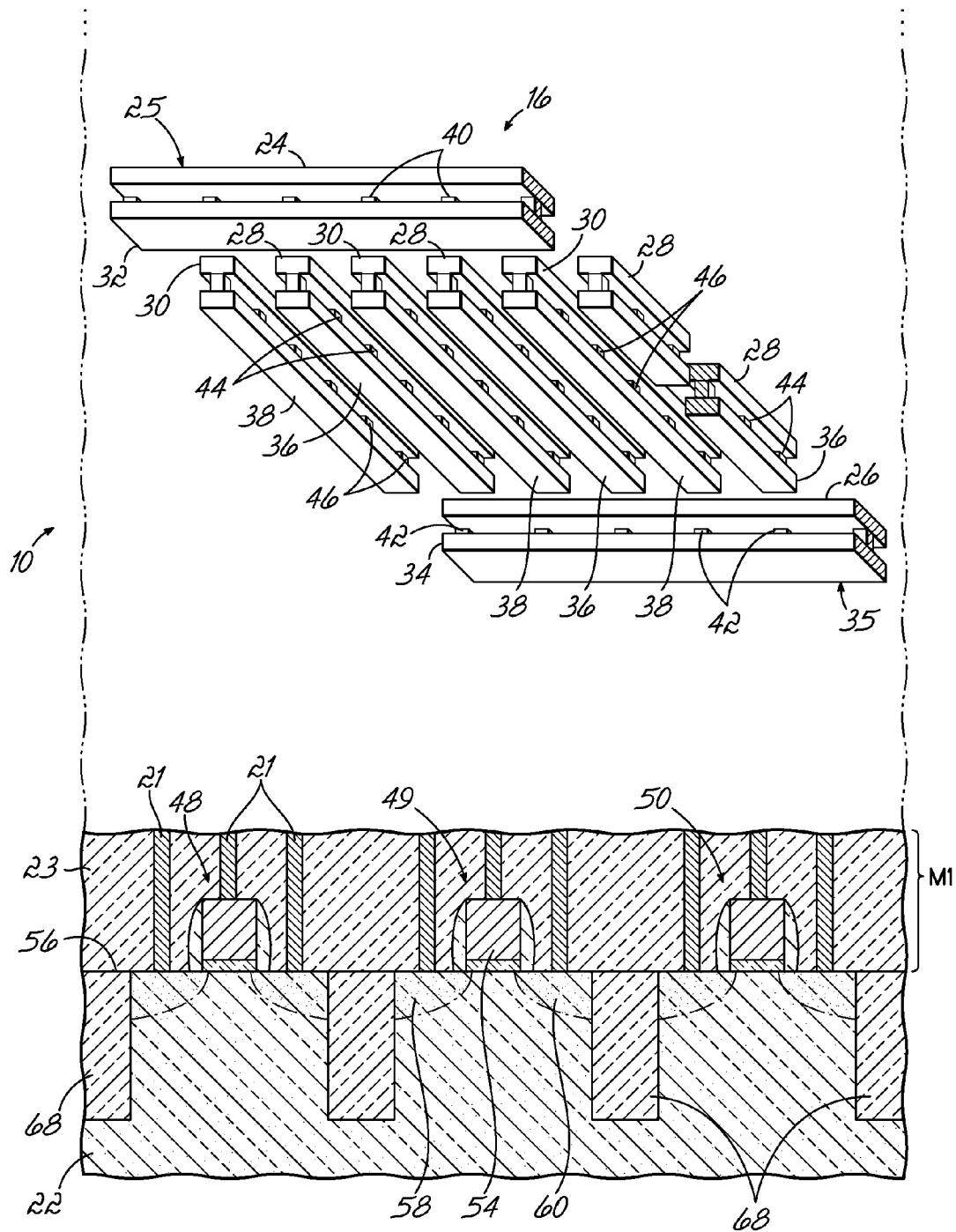
FIG. 1 is a perspective view of a portion of an on-chip capacitor in accordance with an embodiment of the invention.
Figure 2:
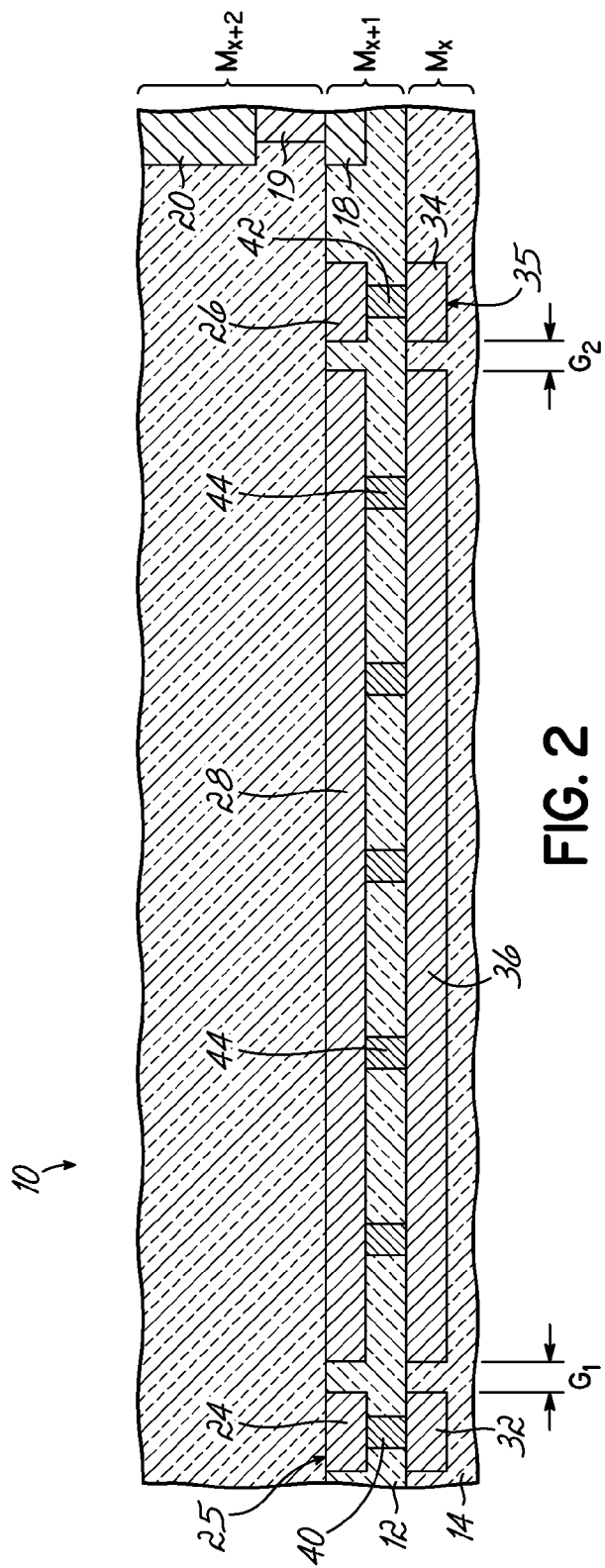
FIG. 2 is a cross-sectional view of a portion of FIG. 1 in which the ports and the electrodes of the on-chip capacitor, as well as the dielectric layers for the metallization levels in which the ports and electrodes are embedded, are visible.
Figure 3:
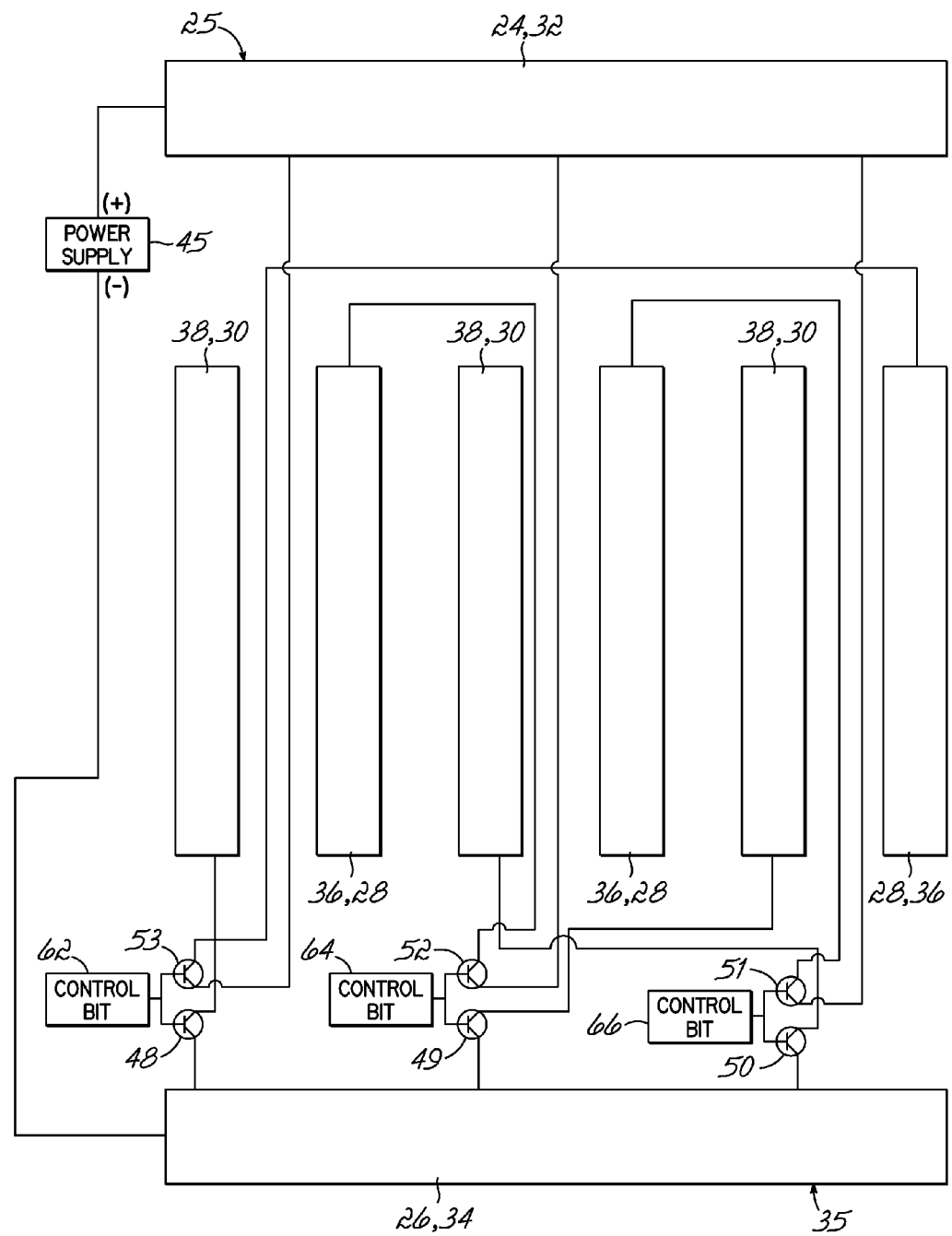
FIG. 3 is a schematic view of the on-chip capacitor and switching devices of FIGS. 1 and 2.

With reference to FIGS. 1-3 and in accordance with an embodiment of the invention, a back-end-of-line (BEOL) wiring structure, generally indicated by reference numeral 10, includes a dielectric layer 12 of a metallization level ($M_{x+1}$), a dielectric layer 14 of a metallization level ($M_x$) underlying the metallization level ($M_{x+1}$), and an on-chip capacitor 16 embedded in the dielectric layers 12, 14. Additional metallization lower levels (not shown) may exist below the metallization levels ($M_x$, $M_{x+1}$) and/or additional metallization levels may exist above the metallization levels ($M_x$, $M_{x+1}$). Conductive features in the different metallization levels of the BEOL wiring structure 10, such as the representative feature 18 in metallization level ($M_{x+1}$) and the representative features 19, 20 in a metallization level ($M_{x+2}$), interconnect active devices of an integrated circuit and may provide circuit-to-circuit connections, or may establish contacts with input and output terminals of the chip.

The on-chip capacitor 16 represents a passive device that is associated with an integrated circuit, such as a radiofrequency integrated circuit (RFIC), which also includes active devices fabricated by front-end-of-line (FEOL) processes on a substrate 22. The device design for such RFICs and the nature of the various FEOL processes used to form the active devices of an RFIC are familiar to a person having ordinary skill in the art. The substrate 22 is typically a chip or die consisting of a piece of a semiconductor wafer composed of a semiconductor material including, but not limited to, silicon (Si), silicon germanium (SiGe), a silicon-on-insulator (SOI) layer, and other like silicon-containing semiconductor materials. The active devices are coupled by contacts 21 and wires (not shown) in a dielectric layer 23 of the local interconnect (M1) metallization level with the overlying metallization levels of the BEOL wiring structure 10 and with each other.

The on-chip capacitor 16 is structured as a vertical natural capacitor formed in two of the metallization levels ($M_x$, $M_{x+1}$) of the BEOL wiring structure 10. The on-chip capacitor 16 includes conductive bars or tabs 24, 26 and electrodes 28, 30 constructed on metallization level ($M_{x+1}$), as well conductive bars or tabs 32, 34 and electrodes 36, 38 constructed on metallization level ($M_x$). Conductive tabs 24, 26 and electrodes 28, 30 are disposed in the same plane of the BEOL wiring structure 10 and are formed from conductor material of a common thickness. Conductive tabs 32, 34 and electrodes 36, 38 are disposed in a different plane of the BEOL wiring structure 10 underlying the plane containing the conductive tabs 24, 26 and electrodes 28, 30. Conductive tabs 32, 34 and electrodes 36, 38 are formed from conductor material of a common thickness. In certain embodiments, the involved metallization levels ($M_x$) and ($M_{x+1}$) for the on-chip capacitor 16 may be the M2 and M3 levels, or the M3 and M4 levels, of the BEOL wiring structure 10.

Conductive tabs 24, 26 have a substantially parallel arrangement and are spaced apart by a distance sufficient to transversely fit the electrodes 28, 30 into the space separating them. Conductive tabs 32, 34 have a substantially parallel arrangement and are spaced by an amount sufficient to transversely fit the electrodes 36, 38 into the space separating them. Interconnect members, in the representative form of a row of spaced-apart vias 40 defined in the dielectric layer 14, extend vertically between conductive tab 24 in metallization level ($M_{x+1}$) and conductive tab 32 in metallization level ($M_x$). Interconnect members, in the representative form of a row of spaced-apart vias 42 defined in the dielectric layer 14, extend vertically between conductive tab 26 in metallization level ($M_{x+1}$) and conductive tab 34 in metallization level ($M_x$).

Vias 40 electrically short conductive tabs 24, 32 together to define one port, which is generally indicated by reference numeral 25, of the on-chip capacitor 16. Vias 42 electrically short conductive tabs 26, 34 together to define another port, which is generally indicated by reference numeral 35, of the on-chip capacitor 16. Ports 25, 35 of the on-chip capacitor 16 are continuously connected to terminals of opposite polarity at a power supply 45.

In metallization level ($M_{x+1}$), electrodes 28 and 30 project transversely as a substantially parallel set of fingers in the space separating conductive tabs 24, 26. In metallization level ($M_x$), electrodes 36 and 38 project transversely as a substantially parallel set of fingers in the space between conductive tabs 32, 34. Electrodes 28, 30 and electrodes 36, 38 are arranged in respective arrays of rows with one of the electrodes 28 stacked in near vertical alignment above one of the electrodes 36 and one of the electrodes 30 stacked in near vertical alignment above one of the electrodes 38. Specifically, the lateral sidewalls of the electrodes 28 are approximately aligned, when viewed in a vertical direction, with the lateral sidewalls of the electrodes 36. Similarly, when viewed in a vertical direction, the lateral sidewalls of the electrodes 30 are approximately aligned with the lateral sidewalls of the electrodes 38.

With continued reference to FIGS. 1-3, electrodes 28 and 30 have an interleaved arrangement relative to each other that is effective to define a construction in which one of the electrodes 28 is disposed between each adjacent pair of electrodes 30 and one of the electrodes 30 is disposed between each adjacent pair of electrodes 28. Similarly, electrodes 36 and 38 are interleaved such that one of the electrodes 36 is disposed between each adjacent pair of electrodes 38 and one of the electrodes 38 is disposed between each adjacent pair of electrodes 36. Slots or spaces between adjacent pairs of the electrodes 28 and 30 and adjacent pairs of electrodes 36 and 38 are filled with portions of the dielectric layers 12, 14, which supply electrical isolation. In addition, the tip of each of the electrodes 28, 30, 36, 38 is separated from the adjacent conductive tabs 24, 26, 32, 34 by a respective small gap, $G_1$. The opposite tip of each of the electrodes 28, 30, 36, 38 is separated from the adjacent conductive tabs 24, 26, 32, 34 by a respective small gap, $G_2$. Hence, as constructed, the electrodes 28, 30, 36, 38 are electrically floating relative to the conductive tabs 24, 26, 32, 34 and lack any direct physical connection with the conductive tabs 24, 26, 32, 34.

Interconnect members, in the representative form of a row of spaced-apart vias 44, extend vertically in dielectric layer 12 between the electrodes 28 in metallization level ($M_{x+1}$) and the electrodes 36 in metallization level ($M_x$). Vias 44 electrically connect each individual stacked pair of the electrodes 28 and 36 in parallel. Similarly, interconnect members, in the representative form of a row of spaced-apart vias 46, extend vertically in dielectric layer 12 between the electrodes 30 in metallization level ($M_{x+1}$) and the electrodes 38 in metallization level ($M_x$). Vias 46 electrically connect each individual stacked pair of the electrodes 30 and 38 in parallel.

The on-chip capacitor 16 may have one or more additional rows of interleaved electrodes (not shown) in a metallization level of the BEOL wiring structure 10 either below metallization level ($M_x$) or above metallization level ($M_{x+1}$) to provide a construction characterized by more than two levels as in the representative embodiment. These additional electrodes are connected by additional rows of vias (not shown) with either electrodes 28, 36 or electrodes 30, 38 contingent upon vertical alignment. In one specific embodiment of the invention, the involved metallization levels for a three-level capacitor construction of the on-chip capacitor 16 may be the M2, M3, and M4 levels of the BEOL wiring structure 10.

The on-chip capacitor 16 features a plurality of capacitance states when different contact combinations are selected. Specifically, field effect transistors 48, 49, 50, 51, 52, 53, of which only field effect transistors 48, 49, 50 are visible in FIG. 1, are employed to electrically connect the electrodes 28, 30, 36, 38 in a selective manner with the conductive tabs 24, 26, 32, 34. The field effect transistors 48-53 are among the active devices on the substrate 22 and may be fabricated by complementary metal-oxide-semiconductor (CMOS) processes. Each of the field effect transistors 48-53 has a respective gate stack 54 residing on a top surface 56 of the substrate 22 and respective source/drain regions 58, 60 defined as heavily doped regions in the semiconductor material of the substrate 22. A control voltage applied to each gate stack 54 is effective to permit current flow in an underlying channel of the semiconductor material of substrate 22, which is disposed between the source/drain regions 58, 60. In an alternative embodiment, one or more of the field effect transistors 48-53 may be replaced by a different type of voltage-controlled device.

With the assistance of the field effect transistors 48-53, the capacitance of the on-chip capacitor 16 is configured to be tunable or variable among multiple different incremental capacitance values. During operation of the associated integrated circuit containing the on-chip capacitor 16 and based upon a perceived need to tune the capacitance of the on-chip capacitor 16, voltage control signals are communicated to the field effect transistors 48-53. The voltage control signals are effective to switch the field effect transistors 48-53 to close respective current paths connecting each of the electrodes 28, 30, 36, 38 with one of the ports 25, 35. As a result, the capacitance of the on-chip capacitor 16 can be actively varied while the associated integrated circuit carried on substrate 22 is operating. Therefore, adjustments in the capacitance of the on-chip capacitor 16 are programmable.

As best shown schematically in FIG. 3, each of the field effect transistors 48-53 controls whether a particular via-connected pair of the electrodes 28, 36 or a particular via-connected pair of the electrodes 30, 38 is connected to the on-chip capacitor 16 and, therefore, whether its capacitance contributes to the total capacitance of the on-chip capacitor 16. Specifically, field effect transistors 48 and 53 are concurrently switched by a control voltage or bit 62 to selectively connect one via-connected pair of electrodes 28, 36 in a closed circuit with port 25 and one via-connected pair of electrodes 30, 38 in a closed circuit with port 35. Similarly, field effect transistors 49 and 52 are concurrently switched by a control voltage or bit 64 to selectively connect a different via-connected pair of electrodes 28, 36 in a closed circuit with port 25 and a different via-connected pair of electrodes 30, 38 in a closed circuit with port 35. Field effect transistors 50 and 51 are concurrently switched by a control voltage or bit 66 to selectively connect yet another via-connected pair of electrodes 28, 36 in a closed circuit with port 25 and yet another via-connected pair of electrodes 30, 38 in a closed circuit with port 35. Because the electrodes 28, 36 and the electrodes 30, 38 are wired in parallel by vias 44, 46, respectively, each of the field effect transistors 48-53 controls whether or not an entire electrode stack is powered.

The aggregate number of pairs of electrodes 28, 36 connected in a closed circuit with port 25 and the aggregate number of pairs of electrodes 30, 38 connected in a closed circuit with port 35 determines the capacitance value of the on-chip capacitor 16. Only one of the control bits 62, 64, 66 may be selected such that only one via-connected pair of electrodes 28, 36 is connected in a closed circuit with port 25 and one via-connected pair of electrodes 30, 38 is connected in a closed circuit with port 35. Of course, all of the control bits 62, 64, 66 may be concurrently selected so that all pairs of electrodes 28, 36 are connected in a closed circuit with port 25 and both pairs of electrodes 30 are connected in a closed circuit with port 35 to provide the maximum value of the capacitance. Only two of the three control bits 62, 64, 66 may be selected under voltage control, during the operation of the integrated circuit, such that multiple, but less than all, pairs of electrodes 28, 36 are connected in a closed circuit with port 25 and multiple, but less than all, pairs of electrodes 30, are connected in a closed circuit with port 35. These selections provide capacitance values intermediate between the maximum and minimum capacitance values. Additional electrodes like electrodes 28, 30, 36, 38 may be added within the metallization levels ($M_x$, $M_{x+1}$) of the BEOL wiring structure 10, in conjunction with additional field effect transistors (not shown) among the active devices on the substrate 22, to increase the range of tunability for the variable capacitance of the on-chip capacitor 16.

Symmetrically arranging and switching the electrodes 28, 30, 36, 38 promotes the ability to predict the total capacitance and the parasitic capacitance for the on-chip capacitor 16. In an alternative embodiment, additional control bits similar to control bits 62, 64, 66 can be provided such that each individual field effect transistor 48-53 is subject to separate voltage control during operation of the integrated circuit. Each of the via-connected pairs of electrodes 28, 36 and each of the via-connected pairs of electrodes 30, 38 adds approximately the same nominal incremental capacitance to the total capacitance of the on-chip capacitor 16. The ability to adjust the total capacitance of the on-chip capacitor 16 in discrete amounts may be useful, for example, to adjust the resonance frequency output by an LC resonator commonly found in an RFIC.

As a result of the opposite polarity electrical connection with the ports 25, 35 and the interleaved arrangement, the stacked pairs of electrodes 28, 36, and the stacked pairs of electrodes 30, 38 are electrically connected in a selective manner by the control bits 62, 64, 66 to the power supply terminals of opposite polarity to generate a capacitance laterally between the different electrodes 28, 30 in metallization level ($M_{x+1}$) and laterally between the electrodes 36, 38 in metallization level ($M_x$).

As mentioned above, the on-chip capacitor 16 is formed by damascene processes conventionally associated with BEOL processing, which is used to form the conductive features in the various different stacked metallization levels of the BEOL wiring structure 10. Because of this commonality during manufacture (having the same material, thickness, etc.), the conductive features of the on-chip capacitor 16 are concurrently formed with the other conductive features, such as the representative conductive features 18, 19, 20, that are used to establish electrical connections with the active devices.

Specifically and with reference to FIGS. 1-3, dielectric layer 14 of metallization level ($M_x$) is applied by a conventional deposition technique recognized by a person having ordinary skill in the art. A pattern of via openings and trenches is defined in dielectric layer 14 using known lithography and etching techniques characteristic of a damascene process. To that end, a resist layer (not shown) is applied to the top surface of dielectric layer 14, exposed to radiation to impart a latent image of a trench pattern characteristic of conductive tabs 32, 34 and electrodes 36, 38, and developed to transform the latent image of the trench pattern into a final image pattern with laterally dispersed surface areas of dielectric layer 14 unmasked at the future sites of conductive tabs 32, 34 and electrodes 36, 38. Unmasked regions of dielectric layer 14 at these sites are removed with an etching process, such as reactive ion etching (RIE), capable of producing substantially vertical sidewalls for the trenches. The resulting trenches are filled using a conventional deposition process with amounts of a representative conductor to define the conductive tabs 32, 34 and electrodes 36, 38 of metallization level ($M_x$). Any excess overburden of conductor remaining after the filling step is removed by planarization, such as with a chemical mechanical polishing (CMP) process. The resist layer is removed from the top surface of dielectric layer 14.

Dielectric layer 12 of metallization level ($M_{x+1}$) is then applied by a conventional deposition process on dielectric layer 14. A resist layer (not shown) is applied to the top surface of dielectric layer 12, exposed to radiation to impart a latent image of a via opening pattern for vias 40, 42, 44, 46 and developed to transform the latent image of the via pattern into a final image pattern with laterally dispersed surface areas of dielectric layer 12 unmasked at the future sites of vias 40, 42, 44, 46. Unmasked regions of dielectric layer 12 at these sites are removed with an etching process, such as RIE, capable of producing substantially vertical sidewalls for the via openings which extend vertically to intersect the top surfaces of the conductive tabs 32, 34 and electrodes 36, 38. The resist layer is removed from the top surface of dielectric layer 12.

Another resist layer (not shown) is applied to the top surface of dielectric layer 12, exposed to radiation to impart a latent image of a trench pattern for conductive tabs 24, 26 and electrodes 28, 30, and developed to transform the latent image of the trench pattern into a final image pattern with laterally dispersed surface areas of dielectric layer 12 unmasked at the future sites of conductive tabs 24, 26 and electrodes 28, 30. Unmasked regions of dielectric layer 12 at these sites are removed with an etching process, such as RIE, capable of producing substantially vertical sidewalls for the trenches. The resist layer is removed from the top surface of dielectric layer 12.

The via openings and trenches in the dielectric layer 12 are filled with a representative conductor to define the tabs 32, 34, electrodes 36, 38, and vias 40, 42, 44, 46 of metallization level ($M_{x+1}$). Any excess overburden of conductor remaining after the filling step is removed from the top surface of the dielectric layer 12 by planarization, such as a CMP process. Metallization level ($M_{x+2}$) is applied in a manner similar to metallization levels ($M_x$, $M_{x+1}$), as are any additional metallization levels (not shown).

The various resist layers used to form the on-chip capacitor 16 are the resist layers used to form the conventional BEOL metallization contained in metallization level ($M_x$) and metallization level ($M_{x+1}$). Consequently, the conductive features of the on-chip capacitor 16 represent portions of the BEOL metallization in these different metallization levels and may be formed without additional masks.

Dielectric layers 12, 14 may comprise any organic or inorganic dielectric material recognized by a person having ordinary skill in the art, which may be deposited by any number of well known conventional techniques such as sputtering, spin-on application, chemical vapor deposition (CVD) process or a plasma enhanced CVD (PECVD) process. Candidate inorganic dielectric materials for dielectric layers 12, 14 may include, but are not limited to, silicon dioxide, fluorine-doped silicon glass (FSG), and combinations of these dielectric materials. Alternatively, the dielectric material constituting dielectric layers 12, 14 may be characterized by a relative permittivity or dielectric constant smaller than the dielectric constant of silicon dioxide, which is about 3.9. Candidate low-k dielectric materials for dielectric layers 12, 14 include, but are not limited to, porous and nonporous spin-on organic low-k dielectrics, such as spin-on aromatic thermoset polymer resins, porous and nonporous inorganic low-k dielectrics, such as organosilicate glasses, hydrogen-enriched silicon oxycarbide (SiCOH), and carbon-doped oxides, and combinations of organic and inorganic dielectrics.

Candidate conductive materials for the on-chip capacitor 16 include, but are not limited to, copper (Cu), aluminum (Al), alloys of these metals, other similar metals like tungsten (W), and metal silicides. These types of metals may be deposited by conventional processes including, but not limited to, CVD processes, electrochemical processes like electroplating or electroless plating, and silicidation processes as each is understood by a person having ordinary skill in the art.

A relatively thin conductive liner layer (not shown) may respectively clad the metallization of the on-chip capacitor 16 such that the conductor is isolated from the surrounding dielectric material of dielectric layers 12, 14 against unwanted diffusion and such that adhesion is enhanced between the conductor and the dielectric material. Representative thin conductive liner layers include, but are not limited to, a bilayer of titanium and titanium nitride or a bilayer of tantalum or tantalum nitride applied to the dielectric material by conventional deposition processes.

The gate stack 54 for each of the field effect transistors 48-53 includes a gate electrode and a gate dielectric layer positioned between the gate electrode and the top surface 56 of the substrate 22. Each gate stack 54 is formed by conventional fabrication methods that involve the patterning of an appropriate layer stack by techniques understood by a person having ordinary skill in the art. The conductor constituting the gate electrode may be, for example, metal, silicide, polycrystalline silicon (polysilicon), or any other appropriate material(s) deposited by a CVD process, etc. The gate dielectric layer may be composed of any suitable dielectric or insulating material including, but not limited to, silicon dioxide, silicon oxynitride, a high-k dielectric material such as hafnium oxide or hafnium oxynitride, or combinations of these dielectric materials.

Each gate stack 54 and any spacers (not shown) applied to the sidewalls of the gate stack 54 may act as self-aligned masks for one or more ion implantations that define the respective source/drain regions 58, 60 in the semiconductor material of the substrate 22. Techniques for implanting ions to doped such source/drain regions 58, 60 are familiar to persons of ordinary skill in the art. Alternatively, the source/drain regions 58, 60 of the field effect transistors 48-53 may be formed by dopant diffusion or a combination of dopant diffusion and ion implantation. Shallow trench isolation (STI) regions 68, which electrically isolate the source/drain regions 58, 60 of adjacent field effect transistors 48-53, are formed in the substrate 22 by, for example, a conventional patterning, etch, dielectric fill, and planarization process characteristic of standard bulk CMOS processing.

The dielectric layer 23 for the local interconnect (M1) metallization level is applied on the top surface 56 of the substrate 22. Contacts 21, which are formed in the dielectric layer 23, are coupled electrically with the gate electrode of the gate stack 54 and the source/drain regions 58, 60 of each of the field effect transistors 48-53. Each of the contacts 21 connected with the gate electrode of one of the gate stacks 54 is further coupled with one of the control bits 62, 64, 66. One of the contacts 21 connected with one of the source/drain regions 58, 60 of each of the field effect transistors 48-53 is further coupled with either port 25 or port 35. Another of the contacts 21 connected with the other of the source/drain regions 58, 60 of each of the field effect transistors 48-53 is further coupled with one of the pairs of electrodes 28, 36 or with one of the pairs of electrodes 30, 38.

Figure 4:
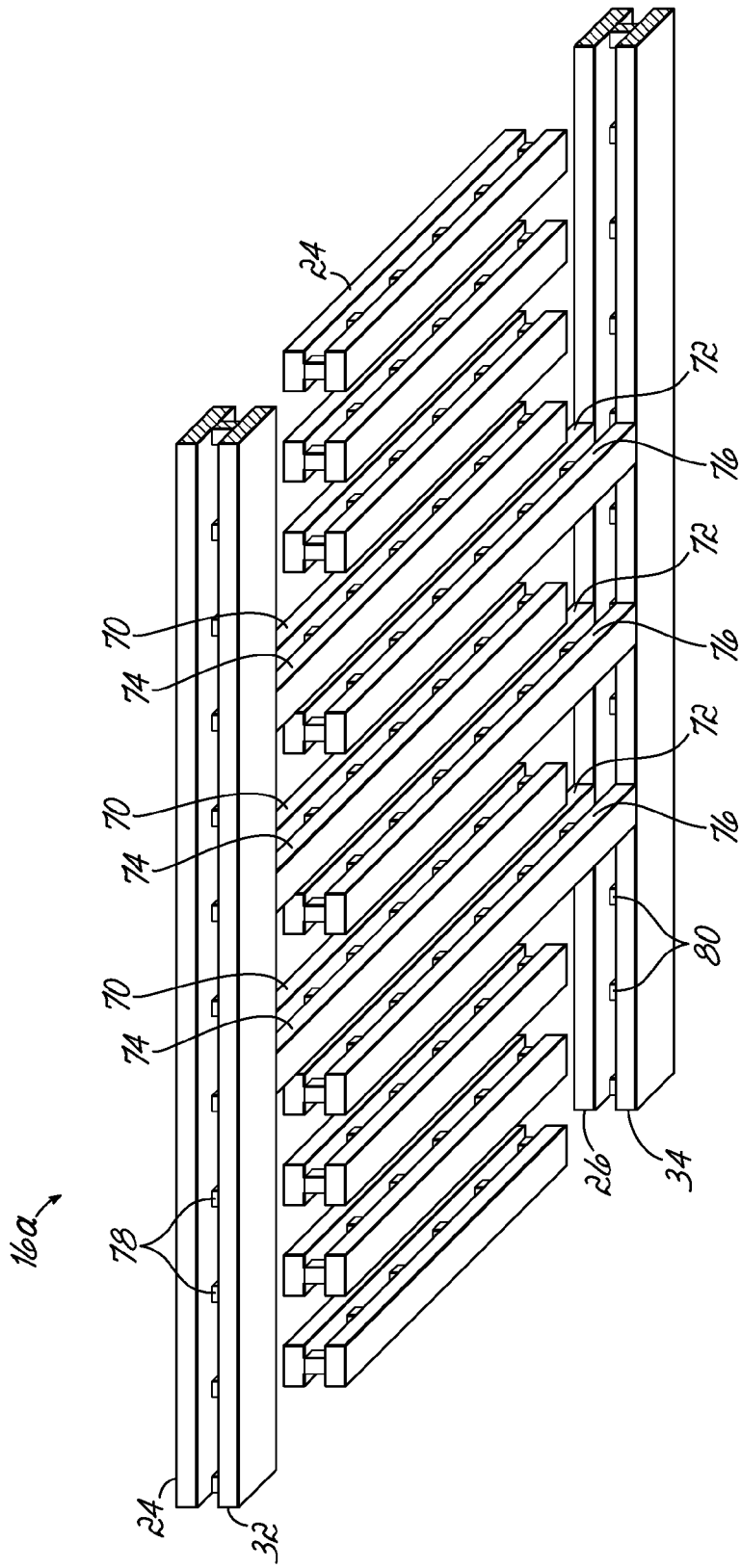
FIG. 4 is a perspective view of an on-chip capacitor in accordance with an alternative embodiment of the invention.

With reference to FIG. 4 in which like reference numerals refer to like features in FIGS. 1-3 and in accordance with an alternative embodiment, an on-chip capacitor 16a, which is otherwise similar to the on-chip capacitor 16, has a fixed capacitance established as a baseline by a plurality of electrodes 70, 72, 74, 76 that are each continuously and directly connected with one of the ports 25, 35. Specifically, electrodes 70, 72 are disposed in the same metallization level ($M_{x+1}$) as electrodes 28, 30 and, similar to electrodes 28, 30, project laterally as substantially parallel fingers in the space between conductive tabs 24, 26. Each of the electrodes 70, 72 is directly coupled with one of the conductive tabs 24, 26. Similarly, electrodes 74, 76 are disposed in the same metallization level ($M_x$) as electrodes 36, 38 and, similar to electrodes 36, 38, project transversely as substantially parallel fingers in the space between conductive tabs 32, 34. Each of the electrodes 74, 76 is directly coupled with one of the conductive tabs 32, 34. In other words, each of the electrodes 70, 72, 74, 76 is continuously tied electrically with one of the ports 25, 35, which provides the fixed capacitance.

Electrodes 70, 72, 74, 76 are fabricated by the same BEOL processes and from the same materials as the electrodes 28, 30, 36, 38 (FIGS. 1-3). Interconnect members, in the representative form of rows of spaced-apart vias 78, extend vertically in dielectric layer 14 between electrodes 70, 74 such that stacked pairs of electrodes 70, 74 are electrically connected. Interconnect members, in the representative form of rows of spaced-apart vias 80, extend vertically in dielectric layer 14 between electrodes 72, 76 such that stacked pairs of electrodes 72, 76 are electrically connected.

Electrodes 28, 30, 36, 38 are used to adjust the capacitance of the on-chip capacitor 16a relative to the baseline capacitance established by the fixed capacitance from electrodes 70, 72, 74, 76. Each of the via-connected pairs of electrodes 28, 36 and each of the via-connected pairs of electrodes 30, 38 adds approximately the same nominal discrete capacitance increment to increase the total capacitance of the on-chip capacitor 16a above the baseline value. As a result, the capacitance of the on-chip capacitor 16 can be adjusted to compensate for process variations in the BEOL processes used to fabricate the on-chip capacitor 16. For example, the on-chip capacitor 16a in the BEOL wiring structure 10 on one chip may have a capacitance that is abnormally high, in which case a subset of the electrodes 28, 30, 36, 38 may be connected to the ports 25, 35 or, alternatively, disconnected from the ports 25, 35. Alternatively, the on-chip capacitor 16a in the BEOL wiring structure 10 on another chip may have a capacitance that is abnormally low, in which instance a different subset of the electrodes 28, 30, 36, 38 may be connected to the ports 25, 35 or, alternatively, disconnected from the ports 25, 35. In either embodiment, capacitance variations of the on-chip capacitor 16a arising from tolerances in the BEOL fabrication processes can be compensated in a programmed manner while retaining the same hardware and after the chip is fabricated, packaged, and deployed in an RFIC. The impact of the ability to fine tune the capacitance is that a designer may effectively make a near zero tolerance version of the on-chip capacitor 16a.

Figure 5:
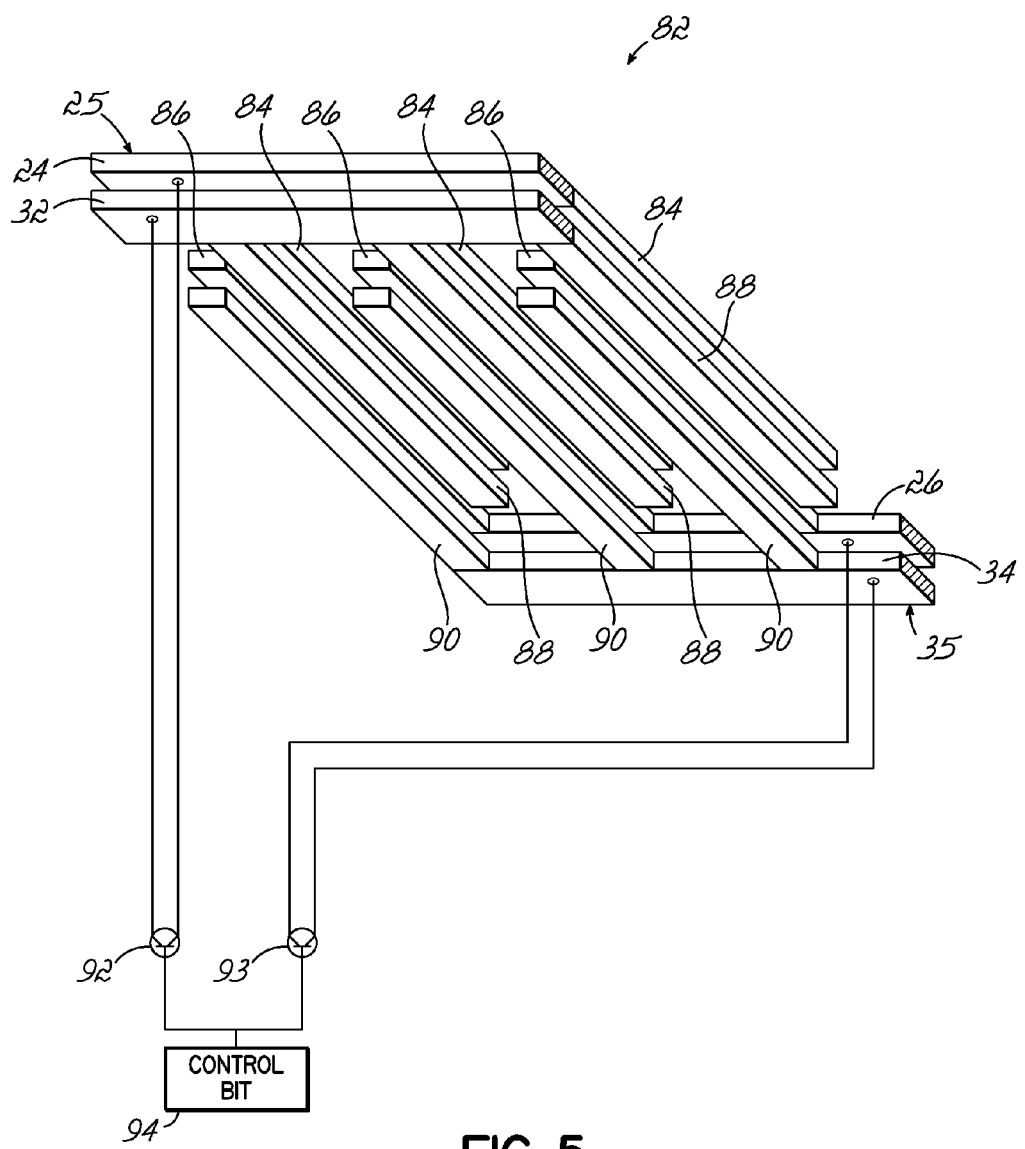
FIG. 5 is a perspective view of an on-chip capacitor in accordance with an alternative embodiment of the invention.

With reference to FIG. 5 in which like reference numerals refer to like features in FIG. 2 and in accordance with an alternative embodiment, an on-chip capacitor 82 has a baseline fixed capacitance established by a plurality of electrodes 84 that are each continuously and directly connected with conductive tab 24 and port 25, and a plurality of electrodes 86 that are each continuously and directly connected with conductive tab 26 and port 35. Electrodes 84, 86, which are disposed in metallization level ($M_{x+1}$) and are similar to electrodes 70, 72 (FIG. 4), project transversely as substantially parallel fingers in the space between conductive tabs 24, 26. Of course, electrodes 84 are electrically isolated by portions of dielectric layer 12 from conductive tab 26 and electrodes 86 are electrically isolated by other portions of dielectric layer 12 from conductive tab 24.

Another plurality of electrodes 88, which are disposed in metallization level ($M_x$), are each continuously and directly connected with conductive tab 32. Similarly, another plurality of electrodes 90, which are disposed in metallization level ($M_x$), are each continuously and directly connected with conductive tab 34. Electrodes 88, 90, which are also similar to electrodes 74, 76 (FIG. 4), project transversely as substantially parallel fingers in the space between conductive tabs 32, 34. Electrodes 88 are electrically isolated by portions of dielectric layer 12 from conductive tab 34 and other portions of the dielectric layer 12 electrically isolate electrodes 90 from conductive tab 32.

The electrodes 84, 86, 88, 90 are fabricated by the same BEOL processes and from the same materials as the electrodes 28, 30, 36, 38 (FIGS. 1-3). However, in contrast to on-chip capacitor 16 (FIGS. 1-3) and on-chip capacitor 16a (FIG. 4), the electrodes 84, 88 aligned in each individual vertical stack and the electrodes 86, 90 aligned in each individual vertical stack are not connected by vertical interconnects in the form of vias.

The on-chip capacitor 82 features a binary pair of capacitance states that can be selectively established. Specifically, field effect transistors 92, 93, which are constructed and function similar to field effect transistors 48-53, are employed to electrically connect conductive tabs 24, 26 in a selective manner with conductive tabs 32, 34 when a voltage is applied to a single control bit 94. Specifically, when the control bit 94 is logically switched to cause the field effect transistors 92, 93 to close the respective current paths, conductive tab 24 is electrically connected in an indirect manner through the field effect transistor 92 with conductive tab 32, and conductive tab 26 is electrically connected in an indirect manner through the field effect transistor 93 with conductive tab 34. If the control voltage is absent from control bit 94, conductive tabs 32, 34 and electrodes 88, 90 are electrically floating.

During operation of the associated integrated circuit containing the on-chip capacitor 82 and based upon a need to tune the capacitance of the on-chip capacitor 82, the integrated circuit communicates voltage signals to the field effect transistors 92, 93. With this assistance from the field effect transistors 92, 93, the capacitance of the on-chip capacitor 82 may be coarsely tunable between two significantly different capacitance values. For example, the on-chip capacitor 82 may have a capacitance of about 10 picofarads when only conductive tabs 24, 26 are powered and a capacitance of about 20 picofarads when the control bit 94 is activated to connect conductive tabs 32, 34 with conductive tabs 24, 26, respectively. The voltage signal on control bit 94 is the stimulus effective to cause the field effect transistors 92, 93 to change state and close a current path connecting the conductive tabs 24, 26 with the conductive tabs 32, 34. As a result, the capacitance of the on-chip capacitor 82 can be actively tuned, albeit in a coarse binary manner in comparison with on-chip capacitor 16, while the associated integrated circuit is operating.

In an alternative embodiment, the construction of capacitor 82 can be combined with the construction of either capacitor 16 (FIGS. 1-3) or capacitor 16a (FIG. 4) to provide a device structure in which the resultant capacitor (not shown) can be coarsely tuned using electrodes 84, 86, 88, 90 and control bit 94, and can be finely tuned using electrodes 28, 30, 36, 38 and control bits 62, 64, 66.

Figure 6:
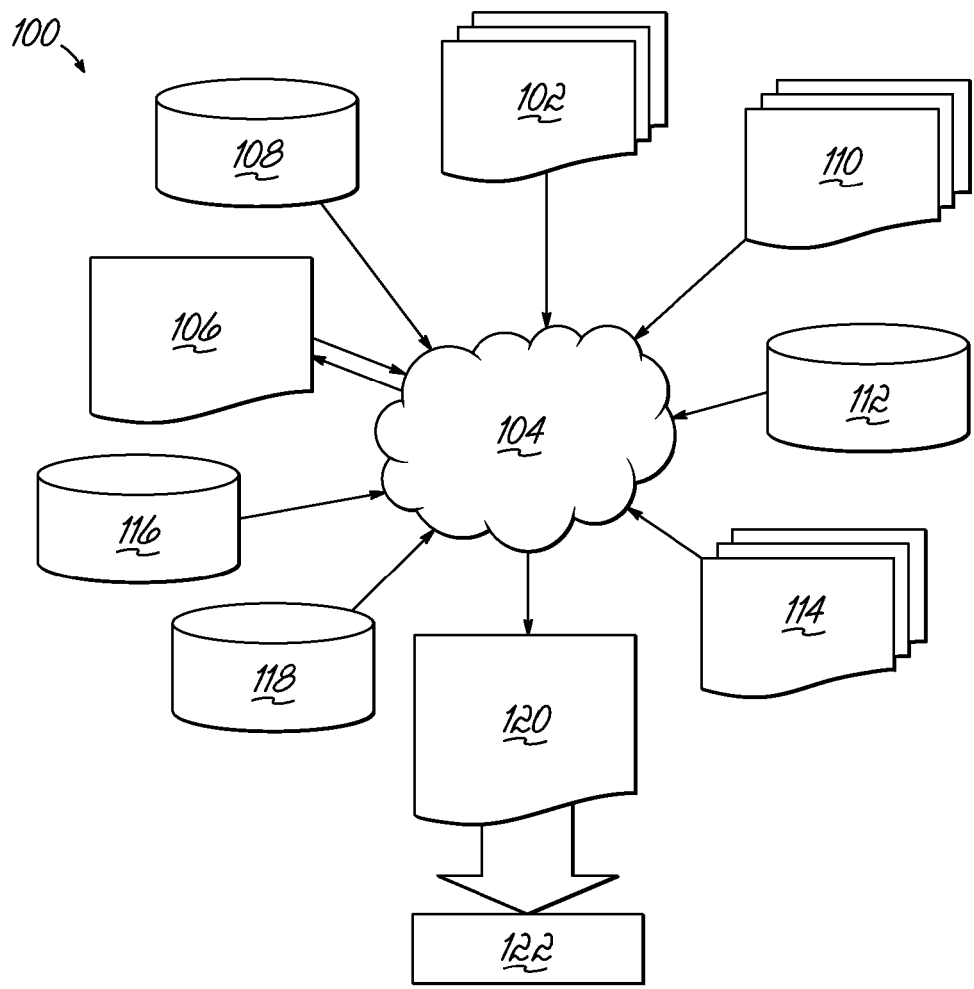
FIG. 6 is a flow diagram of a design process used in semiconductor design, manufacture, and/or test.

FIG. 6 shows a block diagram of an exemplary design flow 100 used for example, in semiconductor IC logic design, simulation, test, layout, and manufacture. Design flow 100 includes processes and mechanisms for processing design structures or devices to generate logically or otherwise functionally equivalent representations of the design structures and/or devices described above and shown in FIGS. 1-5. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-5. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-5 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 120 may comprise a compiled, executable HDL simulation model that functionally simulates the devices shown in FIGS. 1-5.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 120 may then proceed to a stage 122 where, for example, design structure 120: proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

As used herein, the terms "vertical alignment" and "vertically aligned" do not require precise vertical alignment of all edges of vertically aligned objects as some spatial offsets and tolerances are allowed. Objects can overlap, when viewed from a perspective normal to the top surface 56 of the substrate 22, and retain the vertical alignment attribute.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating an on-chip capacitor having a variable capacitance, the method comprising:

forming first and second ports in a dielectric layer that are configured to be powered with opposite polarities and that have a parallel arrangement;

forming a first and second electrodes in the dielectric layer with a parallel arrangement in a space between the first and second ports and aligned transverse to the first and second ports, wherein the first electrode has an end separated from the first port by a first gap so that the first port and the end of the first electrode lack direct physical connection, and the second electrode has an end separated from the second port by a second gap so that the second port and the end of the second electrode lack direct physical connection;

forming a first voltage-controlled unit configured to selectively open and close a first current path coupling the first electrode with the first port; and forming a second voltage-controlled unit configured to selectively open and close a second current path coupling with the second port;

wherein the on-chip capacitor has a larger capacitance value when the first electrode is coupled by the first voltage-controlled unit with the first port and the second electrode is coupled by the second voltage-controlled unit with the second port than when the first and second electrodes are electrically isolated from the first and second ports.

2. The method of claim 1 wherein the on-chip capacitor is carried by a back-end-of-line (BEOL) wiring structure on a chip, and further comprising:

fabricating an integrated circuit on the chip that is electrically coupled with the first and second ports.

3. The method of claim 2 wherein the first and second voltage-controlled units are first and second field effect transistors of the integrated circuit fabricated on the chip.

4. The method of claim 3 wherein forming the first and second voltage-controlled units further comprises:

fabricating the first and second field effect transistors on the chip; and forming conductive features configured to concurrently supply a control voltage to a first gate stack of the first field effect transistor and to a second gate stack of the second field effect transistor to simultaneously couple the first electrode with the first port and the second electrode with the second port and provide the larger capacitance value.

5. The method of claim 2 wherein the on-chip capacitor is configured to be switched by the first and second voltage-controlled units while the integrated circuit is operating.

6. A method of fabricating an on-chip capacitor having a variable capacitance, the method comprising:

forming first and second ports in a dielectric layer that are configured to be powered with opposite polarities;

forming first and second electrodes in the dielectric layer;

forming a first voltage-controlled unit configured to selectively couple the first electrode with the first port; and forming a second voltage-controlled unit configured to selectively couple the second electrode with the second port;

forming a third electrode in the dielectric layer that is directly connected with the first port; and forming a fourth electrode in the dielectric layer that is directly connected with the second port, wherein the on-chip capacitor has a larger capacitance value when the first electrode is coupled by the first voltage-controlled unit with the first port and the second electrode is coupled by the second voltage-controlled unit with the second port than when the first and second electrodes are electrically isolated from the first and second ports, the third and fourth electrodes provide a fixed capacitance that is increased when the first and second voltage-controlled units are in the second state, the on-chip capacitor is integrated into one or more metallization levels of a back-end-of-line (BEOL) wiring structure, and the third and fourth electrodes are formed in a different metallization level than the first and second electrodes.

7. The method of claim 6 wherein the first, second, third, and fourth electrodes are formed with a juxtaposed arrangement, and the first electrode is separated from the second electrode by the third and fourth electrodes.

8. The method of claim 7 wherein the first and second electrodes are formed with a symmetrical arrangement on opposite sides of the third and fourth electrodes.

9. A method of fabricating an on-chip capacitor having a variable capacitance, the method comprising:

forming first and second ports in a dielectric layer that are configured to be powered with opposite polarities;

forming first and second electrodes in the dielectric layer, wherein the first and second electrodes are disposed in a first metallization level of a multi-level back-end-of-line (BEOL) wiring structure;

forming third and fourth electrodes disposed in a second metallization level different than the first metallization level;

forming a first voltage-controlled unit configured to selectively couple the first electrode with the first port; and forming a second voltage-controlled unit configured to selectively couple the second electrode with the second port;

wherein the on-chip capacitor has a larger capacitance value when the first electrode is coupled by the first voltage-controlled unit with the first port and the second electrode is coupled by the second voltage-controlled unit with the second port than when the first and second electrodes are electrically isolated from the first and second ports.

10. The method of claim 9 wherein the third electrode is directly connected with the first port, the fourth electrode is directly connected with the second port, and the third and fourth electrodes provide a fixed capacitance that is increased to provide the larger capacitance value when the first electrode is coupled by the first voltage-controlled unit with the first port and the second electrode is coupled by the second voltage-controlled unit with the second port.

11. The method of claim 9 wherein forming the third and fourth electrodes further comprises:

forming the third electrode with a lateral position in the second metallization level such that the third electrode is aligned vertically with the first electrode; and forming the fourth electrode with a lateral position in the second metallization level such that the fourth electrode is aligned vertically with the second electrode.

12. The method of claim 11 further comprising:

forming a first plurality of metal-filled vias extending between the first electrode and the third electrode so that the first and third electrodes are shorted together; and forming a second plurality of metal-filled vias extending between the second electrode and the fourth electrode so that the second and fourth electrodes are shorted together.

13. The method of claim 9 wherein forming the first and second ports further comprises:

forming the first and second ports with a spaced-apart, substantially parallel arrangement.

14. The method of claim 13 wherein forming the first and second electrodes further comprises:

forming the first and second electrodes between the first and second ports at an orientation that is approximately orthogonal relative to the first and second ports.

* * * * *